(12) United States Patent
Thibedeau et al.

(10) Patent No.: US 7,089,127 B2
(45) Date of Patent: Aug. 8, 2006

(54) INTEGRATED BATTERY SERVICE SYSTEM

(75) Inventors: Dennis G. Thibedeau, Franklin, WI (US); Alejandro P. Brott, Chicago, IL (US); Gary Jonker, Kenosha, WI (US); Leonard Wisneski, Kenosha, WI (US); Paul A. Willems, Kenosha, WI (US); Alan D. Goetzelmann, Wheeling, IL (US)

(73) Assignee: Snap-On Incorporated, Pleasant Prairie, WI (US)

( * ) Notice: Subject to any disclaimer, the term of this patent is extended or adjusted under 35 U.S.C. 154(b) by 115 days.

(21) Appl. No.: 10/460,652

(22) Filed: Jun. 13, 2003

(65) Prior Publication Data

US 2004/0078155 A1 Apr. 22, 2004

Related U.S. Application Data

(60) Provisional application No. 60/387,912, filed on Jun. 13, 2002.

(51) Int. Cl.
*G06F 19/00* (2006.01)

(52) U.S. Cl. .................................. 702/63; 320/132
(58) Field of Classification Search ................ 702/63, 702/64; 320/132, 163
See application file for complete search history.

(56) References Cited

U.S. PATENT DOCUMENTS

| | | | |
|---|---|---|---|
| 4,352,067 A | | 9/1982 | Ottone |
| 4,678,998 A | | 7/1987 | Muramatsu |
| 5,701,089 A | | 12/1997 | Perkins |
| 5,828,201 A | | 10/1998 | Hoffman, Jr. et al. |
| 5,831,435 A | | 11/1998 | Troy |
| 5,955,865 A | * | 9/1999 | Koike et al. ................ 320/104 |
| 6,081,098 A | | 6/2000 | Bertness et al. |
| 6,242,921 B1 | | 6/2001 | Thibedeau et al. |
| 6,274,950 B1 | * | 8/2001 | Gottlieb et al. ................ 307/66 |
| 6,300,742 B1 | * | 10/2001 | Hung ........................ 320/105 |
| 6,331,762 B1 | | 12/2001 | Bertness |
| 6,351,102 B1 | | 2/2002 | Troy |
| 6,359,442 B1 | | 3/2002 | Henningson et al. |
| 6,445,158 B1 | * | 9/2002 | Bertness et al. ............ 320/104 |
| 6,570,385 B1 | * | 5/2003 | Roberts et al. ............. 324/378 |
| 2002/0008523 A1 | | 1/2002 | Klang |

FOREIGN PATENT DOCUMENTS

| | | |
|---|---|---|
| EP | 0 649 208 A2 | 4/1995 |
| GB | 2 322 743 A | 9/1998 |
| WO | WO 94/05068 | 3/1994 |
| WO | WO 99/18448 | 4/1999 |

\* cited by examiner

*Primary Examiner*—Edward Raymond
(74) *Attorney, Agent, or Firm*—McDermott Will & Emery LLP

(57) ABSTRACT

An integrated battery service system performs a plurality of services related to a battery, such as battery testing, battery charging, and the like. In addition, the integrated service system provides services to devices/components that are coupled to the battery, such as starters, alternators, etc. The integrated battery service system allows a user to abort a service and then resume the process from where the process was aborted. When conducting a service, the integrated battery service system determines a noise level caused by devices/components coupled to the battery. The integrated battery service system includes connectors configured to couple to a battery for receiving input signals, a processor coupled to the connectors, and a memory device coupled to the processor for storing control codes and operation history. The control codes, when executed by the processor, control the system to selectively abort a service in response to a user input. Since the memory stores operation histories, the processor may access the memory to retrieve data related to the aborted service and parameters obtained during the service before the process was aborted. The system reinstates the aborted service in response to another user input.

26 Claims, 9 Drawing Sheets

INTEGRATED BATTERY SERVICE SYSTEM

RELATED APPLICATION

This application claims the benefit of priority from U.S. Provisional Patent Application Ser. No. 60/387,912, entitled "MULTI-FUNCTION BATTERY SERVICE SYSTEM," filed Jun. 13, 2002, which is incorporated herein by reference in its entirety.

FIELD OF THE DISCLOSURE

The disclosure relates generally to a battery service system, and more specifically, to an integrated battery service system that provides advanced control for servicing rechargeable batteries as well as components coupled to the battery based on signals obtained from the battery.

BACKGROUND OF THE DISCLOSURE

Conventionally, battery testers are implemented as a single-function system used exclusively for testing battery conditions. Some newer systems combine battery testing functions with battery charging functions such that rechargeable batteries are tested before being charged to distinguish bad batteries from good batteries, as bad batteries are incapable of delivering or accepting adequate charge. The functions of these newer systems are limited to servicing the battery only, and do not extend their functions to test other devices and/or components that are coupled to a rechargeable battery, such as alternators, starters and the like in a motor vehicle.

Furthermore, the service process of a conventional battery tester tends to be lengthy. If the service process is interrupted or aborted for any reason, the user has to start the whole process all over again, which will reduce productivity. In addition, conventional battery testing process is subject to noise interference, especially from components, subsystems, and/or devices coupled to the battery. For example, in a motor vehicle, noise signals generated by the operation of a stereo system and/or fans that coupled to the battery may enter the battery tester during a battery test process and interfere with the test result.

Therefore, there is a need to provide an integrated battery service system to service the battery as well as various devices and/or components that are coupled to the battery. There is another need for a battery service system that allows users to resume an aborted testing process from where it was aborted without the need to conduct the whole test all over again. There is also a need for a reliable battery service system that takes noise signals into consideration when testing batteries.

SUMMARY OF THE DISCLOSURE

An exemplary integrated battery service system disclosed herein addresses the above noted needs as well as other needs and problems. The integrated battery service system is configured to perform a plurality of services related to a battery, such as battery testing, battery charging, and the like. In addition, the integrated service system provides services to devices/components that are coupled to the battery, such as starters, alternators, etc. The integrated battery service system may allow a user to terminate a service process and then resume the process from where the process was terminated. When conducting a battery service process, the integrated battery service system may consider noise signals generated by devices/components coupled to the battery.

An exemplary integrated battery service system includes connectors configured to couple to a battery for receiving input signals, a processor coupled to the connectors, and a memory device coupled to the processor for storing data. The battery service system has an alternator testing circuit coupled to the connectors and the processor for determining an operation status of an alternator based on the input signals. The integrated battery service system also provides other service functions, such as starter tests, battery charging, noise detection, etc.

In one aspect, the battery testing circuit includes a signal source coupled to the battery that continuously generates signals with time variant components configured to apply to the battery. The signal source may be an oscillator that continuously generates an AC signal when the battery service system is powered on. The processor is configured to receive signals representing a battery response to the signals with time variant components and to generate a battery parameter based on the battery response to the signals with time variant components. For instance, based on the battery's response to the AC signal generated by the oscillator, the processor calculates impedance/conductance of the battery. The integrated battery service system may determine the health of the battery based on the impedance/conductance of the battery. The AC signal is kept on until the system is powered off. The processor periodically or continuously calculates impedance/conductance of the battery and provides the results to a user of the system. The memory may be configured to store a history of the battery parameter and an output device may be provided to generate an output representing the history of the battery parameter.

According to an embodiment, a battery service system according to this disclosure includes connectors configured to couple to a battery, a processor for executing control codes and a memory device coupled to the processor for storing the control codes. The memory is configured to store service histories. The control codes, when executed by the processor, control the system to selectively abort a service process in response to a user input. Since the memory stores the history of the service process, the processor may access the memory to retrieve data related to the aborted service and parameters obtained during the service process before the process was aborted. The system continues the aborted battery service in response to another user input. Thus, a user of the system may freely abort a service process and then resume the process from where the process was stopped. In one aspect, the battery service system may abort or stop a service process automatically in response to a specific event, such as the connectors being removed from the battery terminals. The battery service system may continue the aborted service process after proper connections between the battery service system and the battery are restored.

According to another embodiment, an exemplary integrated battery service system determines the level of noise appearing during a test process. The battery service system comprises connectors configured to connect to the battery for receiving input signals, a processor and a memory device for storing a first reference parameter. The processor is configured to execute control codes that control the processor to obtain multiple battery parameters by determining a battery parameter based on the input signals multiple times; and determine a testing condition based on the first reference parameter, the multiple battery parameters, and a determination rule. In one aspect, the battery parameter is the impedance of the battery, the first reference parameter is a specific range, and the determination rule requires that the variations of the multiple battery parameters fall within the specific range.

In another aspect, if the battery is stable, the processor compares the multiple battery parameters with a second reference parameter. The processor may determine the battery as stable if the changes of the multiple battery parameters fall within the specific range.

According to still another aspect, the processor is configured to carry out a plurality of service processes in response to the multiple battery parameters being larger than the second reference parameter. The service processes may include measuring an open circuit parameter of the battery based on the input signals; determining a battery response to a reference load coupled to the battery; decoupling the reference load from the battery; measuring a change in the battery response; and determining a test noise status based on the battery response.

According to another embodiment of the battery service system, the battery service system has a processor for executing control codes, a fan for dissipating heat, and a monitor circuit coupled to the fan and the processor for generating a signal indicating the operation status of the fan. In one aspect, in response to a signal indicating that the fan is not operating properly, the processor generates a warning signal.

Additional aspects and advantages of the present disclosure will become readily apparent to those skilled in this art from the following detailed description, wherein only exemplary embodiments of the present disclosure is shown and described, simply by way of illustration of the best mode contemplated for carrying out the present disclosure. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

The invention is illustrated by way of example, and not by way of limitation, in the figures of the accompanying drawings in which like reference numerals refer to similar elements and in which.

DETAILED DESCRIPTION OF ILLUSTRATIVE EMBODIMENTS

For purpose of illustration, an exemplary integrated battery service system is described. The integrated battery service system provides advanced control for servicing rechargeable batteries as well as components coupled to the battery based on signals obtained from the battery. In the following description, numerous specific details are set forth in order to provide a thorough understanding of the integrated battery service system. It will be apparent, however, to one skilled in the art that the invention may be practiced without these specific details. In other instances, well-known structures and devices are shown in block diagram form in order to avoid unnecessarily obscuring the present invention.

System Architecture

Figure 1A:
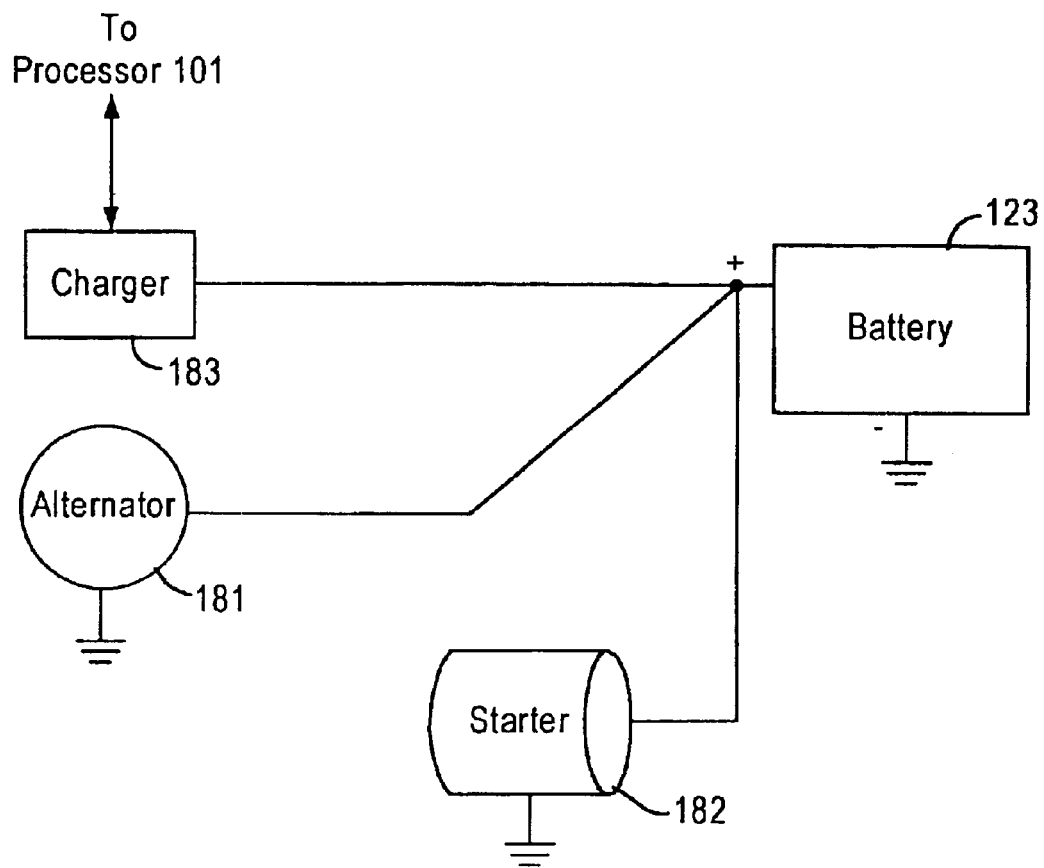
FIGS. 1A and 1B show a block diagram of an integrated battery service system implemented according to the present disclosure under operation.
Figure 1B:
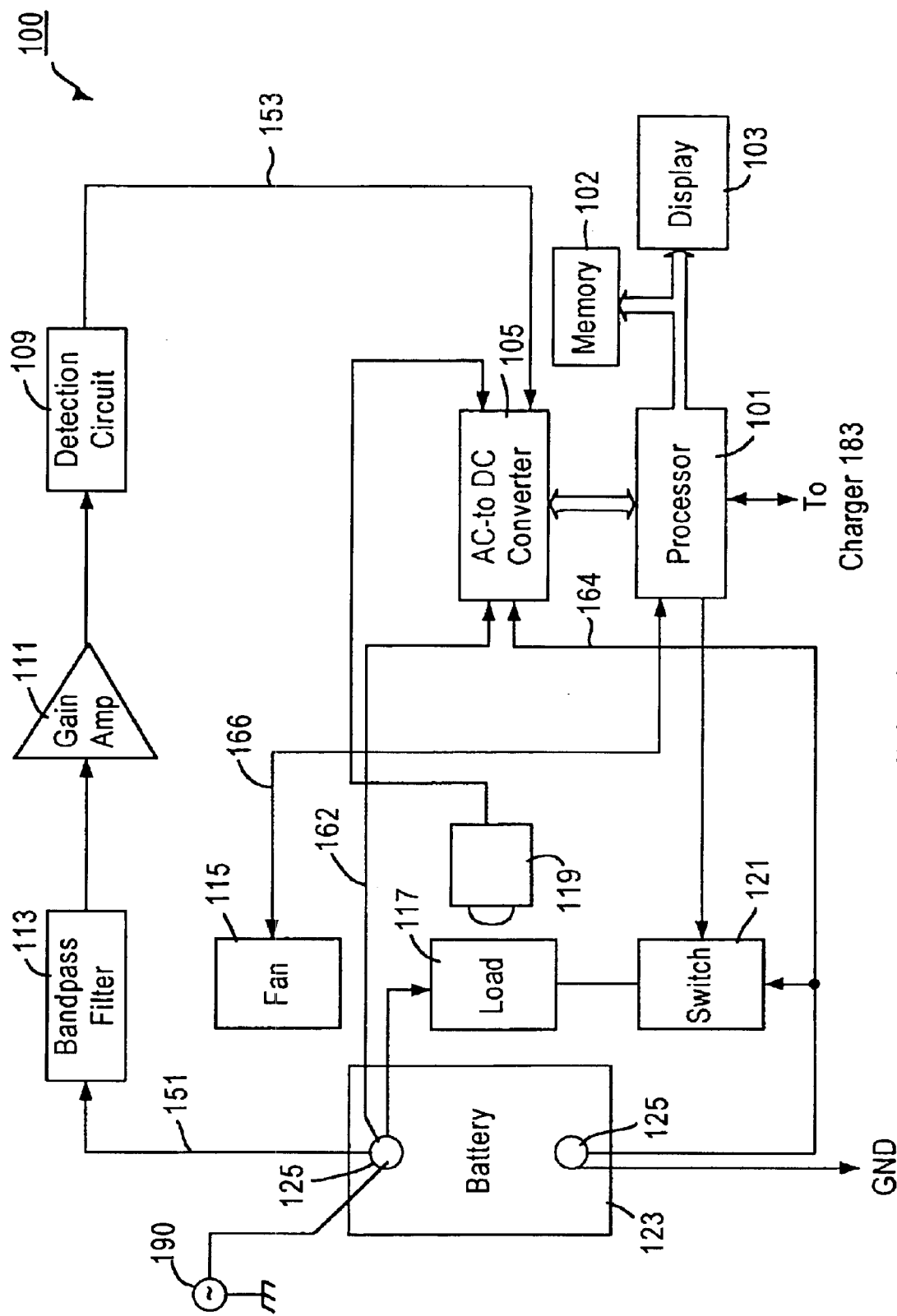

FIGS. 1A and 1B together show a block diagram of an integrated battery service system implemented under operation. For purpose of illustration, the operation of the integrated battery service system is described with a starter 182 and an alternator 181 of an automotive vehicle. In an automotive vehicle, the alternator 181 is driven by the engine of the automotive vehicle (not shown) to generate electricity. The output of the alternator 181 is coupled to a battery 123 via a set of battery terminals 125. The starter 182 is also coupled to the battery terminals 125 for drawing currents to crank the engine in the automotive vehicle. A charger 183 coupled to the battery terminals 125 for charging the battery 123 is also shown. The charger 183 may be a part of the integrated battery service system 100.

The integrated battery service system 100 has a set of connectors for connecting to the battery 123. For example, the battery service system 100 may include a set of clamps (not shown) for connecting to the battery terminals 125 and receiving signals therefrom. The clamps may be implemented using Kelvin connectors that include a small conductor to a sense jaw and a large conductor to a load jaw.

The battery service system 100 utilizes a measurement circuitry (not shown in FIG. 1B) to measure output signals obtained from the battery terminals 125 as well as from other signal paths. The measurement circuitry may include a voltage measurement circuitry and a current measurement circuitry that provide outputs to the processor 101 via test signal 162 and 164. The test signals 162 and 164 may be voltage and/or current signals in AC and/or DC obtained from the battery terminals 125 by the connectors and/or other signal paths. The test signals 162, 164 enter the processor 101 via an AC-to-DC converter 105.

The battery service system 100 has a processor 101, an analog-to-digital converter 105, a memory device 102 and a display 103. The processor 101 is configured to process data, execute control codes and generate control signals. The memory device 102 is coupled to the processor 101 for storing data and control codes. Different types of memory devices may be used or used in combination, such as volatile memory and/or non-volatile memory including a CD-ROM, any other optical medium, punch cards, paper tape, any other physical medium with patterns of holes, a RAM, a PROM, EPROM, a FLASH-EPROM.

The analog-to-digital converter 105 converts analog signals to digital signals. The display 103 provides a communication interface with a user. The display 103 may be an LCD screen, an LED indicator and/or the like. The service system 100 also includes an input device (not shown) coupled to the processor 101. The input device may be control buttons, keyboards, cursor control devices, touch screen input devices, voice recognition devices, etc., or signals received from other systems connected to the battery service system 100.

The battery service system 100 may include output connectors and/or interfaces for outputting signals to, or communicating with, other devices, such as serial port, parallel port, USB port, PS/2 port, IEEE-1394 port, infra red communication port, etc., and/or other proprietary ports.

The processor 101 may control a switch device 121, such as an FET switch, that selectively couples a load 117 to the alternator. As illustrated in FIG. 1B, switch device 121 and load 117 are serially connected and then coupled to the battery 123 in parallel via the battery terminals 125. If the switch device 121 is on, the load 117 is coupled to the battery 123; if the switch device 121 is off, the load 117 is decoupled from the battery 123. Other circuit design techniques known to persons skilled in the art can be used for controlling the coupling of the load 117 to the battery 123.

The load 117 may be any component that is capable of drawing large currents from the alternator, while maintaining small voltage across it. For example, the load 117 may include two Nichrome coils or carbon piles or a combination of both that are capable of drawing 50 amperes of current and 175 amperes of current, respectively. A Nichrome coil load is advantageous due to its ability to handle a substantial amount of current, while maintaining compact sizing.

The battery service system 100 has a signal source coupled to the connectors for continuously generating signals with time variant components configured to apply to the battery when the connectors are connected to the battery 123. The signal source may be an oscillator 190 that continuously generates an AC signal when the battery service system 100 is powered on. The battery service system 100 continuously applies the AC signal to the battery 123. The processor 101 receives signals representing a battery response to the AC signals with time variant components and calculates battery parameters based on the battery response to the AC signal.

A sensor 119 coupled to the AC-to-DC converter 105 is provided to detect the temperature of the load 117 and/or the system 110, and convey the same to the processor 101. A cooling device 115, such as a cooling fan, may be provided to help dissipate heat generated by the load 117. A signal 166 between the cooling device 115 and the processor 101 includes a control signal for controlling the operation of the cooling device 115 and/or a feedback signal indicating the operation status of the cooling device 115.

A bandpass filter 113 is provided to eliminate harmonics as well as noise picked up at the battery terminals 125. Bandpass filter 113 may have a pass band between 100 Hz and 4 kHz. A gain amplifier 111 is provided to amplify signal levels. A detection circuit 109 is coupled to the gain amplifier 111 and generates a parameter signal 153 representative of parameters obtained from the battery terminals 151. The parameters are used by processor 101 to determine the characteristics of the battery 123 or devices coupled to the battery 123, such as the alternator 181. Techniques using parameters of alternator output signals to determine alternator operation are described in U.S. Pat. Nos. 3,629,704, 4,459,548, 4,315,204, and 6,242,921, the entireties of which are incorporated herein by reference.

Service Functions

The battery service system 100 performs numerous service functions related to the battery 123 as well as devices coupled to the battery 123, such as the alternator 181 and the starter 182. Examples of service functions provided by the integrated battery service system 100 are described below:
(1) System Test
The battery service system 100 provides a system test function. A system test is a series of tests conducted on the battery 123 and/or other systems or devices coupled to the battery, such as the alternator 181 and/or the starter 182. The system test may include a battery test, an alternator test, and/or a starter test, and the like. Since the battery test can greatly influence the results of the other two tests, it is important to consider the battery test results when performing and evaluating those other tests. For example, the system test first tests the battery. If the battery passes the test, the battery service system 100 starts the starter test and/or the starter tester. If the battery test fails, the battery service system 100 either charges the battery or informs the operator of the battery failure by, for example, generating a warning signal on the display 103. If the battery should be charged, the operator has the option to proceed charging the battery or to skip the charge cycle. In addition to the system test, the battery service system 100 may conduct these tests individually.

(2) Battery Testing and Charging

During an exemplary battery testing and charging procedure, the battery service system 100 performs the following steps:

A. Battery Test:

1) Check Connections:

a) The processor 101 receives voltage and current obtained form the battery 123 via signals 162 and 164.

b) The processor 101 determines if the battery 123 is connected and if all jaws have a good connection 2) The battery service system 100 receives operator inputs related to battery specifications, such as CCA, CA, DIN, EN input or other specifications regarding size of the battery 123 under test, via the user input device of the battery service system 100.

3) Perform Battery Impedance Test:

The battery service system 100 measures the battery internal impedance, also known as internal resistance. The processor 101 receives the battery's response to an AC signal generated by the AC oscillator 190, and calculates the impedance of the battery 123 based on the AC signal and the battery's response thereto.

4) Perform Load Test a) During a load test event, the processor 101 turns on the fan 115 to assist dissipating heat generated during the load test.

b) The processor 101 sends a control signal to switch 121 to engage the load 117 to apply a 150 amp resistive load for several seconds.

c) The processor 101 then measures terminal loaded voltage via sense leads and the current.

d) The processor 101 then sends a control signal to switch 121 to disengages the load 117.

e) The processor 101 then measures bounce-back voltage.

5) Determine Battery Test Results a) Based on parameters obtained in the previous steps, the processor 101 calculates battery test results.

b) If the battery 123 is determined good, the processor 101 controls to exit the battery test and indicate results on the display 103.

c) If battery 123 is determined bad, the processor 101 controls to exit battery test and indicate results on the display 103.

d) If battery 123 is determined marginal, the processor 101 controls to enter a battery charge routine.

B. Battery Charge

Battery charge is conducted by the charger 183. The charger 183 generally includes an AC source, a transformer and a rectifier. The processor 101 couples the charger 183 to the battery 123 through electrical connection that couples to the positive terminal of the battery and to the negative terminal of battery 123. In one embodiment, a four point (or Kelvin) connection technique is used in which the charger 183 is coupled to the battery while the battery testing circuitry couples to the battery.

The battery service system 100 provides four different charging modes: (1) Automatic charging; (2) Manual Charging; (3) Trickle Charging; and (4) Crank Assist Charging. Under the Automatic charging mode, the battery service system 100 automatically charges the battery 123 without user intervention. Under the Manual charging mode, the battery service system 100 provides a continuously adjustable voltage range to allow an operator to establish a target charging voltage. During the Manual charging mode, the battery service system 100 maintains the battery voltage at a specific level. The battery voltage level may be continuously adjusted by the operator. The Manual changing mode may be applied to batteries while repair is performed to the vehicles so that the battery voltage will not drop below minimum specifications when a computer relearn is necessary.

Another charge mode is the Trickle charge, this limits the current and voltage too much lower levels. This operation mode is optimal for small 12 Volt battery applications, such as motorcycle, lawn mower, etc. The Crank assist charging mode allows the battery service system 100 to boost start a vehicle. Under the Crank assist charging mode, the battery service system 100 will pre-charge the battery for 1–5 minutes, depending on the battery size, condition and temperature of the battery before allowing the user to attempt to start the disabled vehicle.

C. Variable Charge Level

The battery service system 100 provides a service function to charge the battery 123 at a charge level that is continually adjustable. For example, in the Manual charging mode as described earlier, the battery service system 100 allows an operator to establish a target charging voltage within a continually adjustable voltage range. In response, the battery service system 100 controls to increase/decrease the battery voltage until the target battery voltage is reached. The battery service system 100 then maintains the battery voltage at the target battery voltage.

Figure 1C:
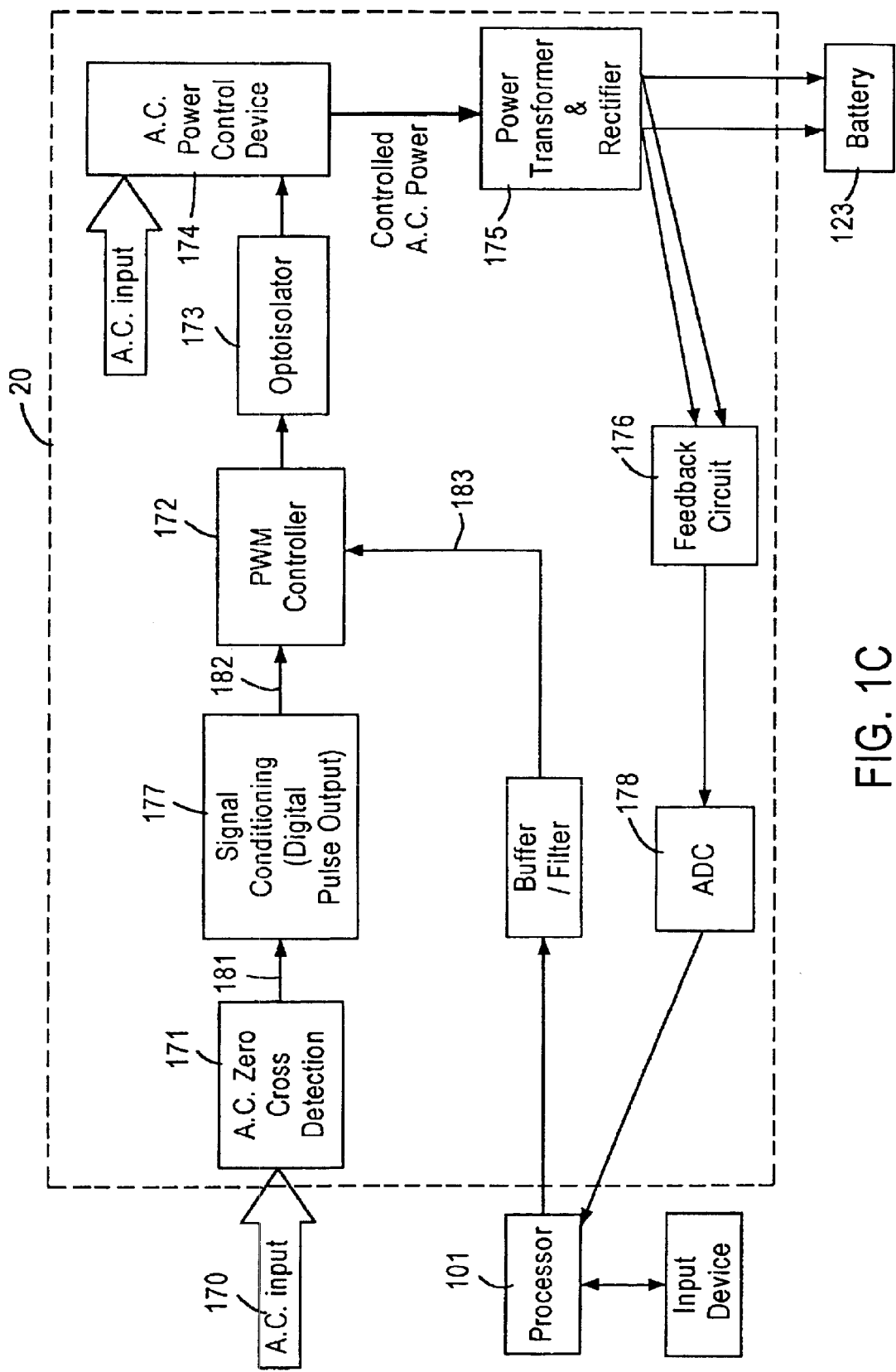
FIG. 1C depicts a block diagram of a control circuit for controlling the charge level of the battery service system.
Figure 1D:
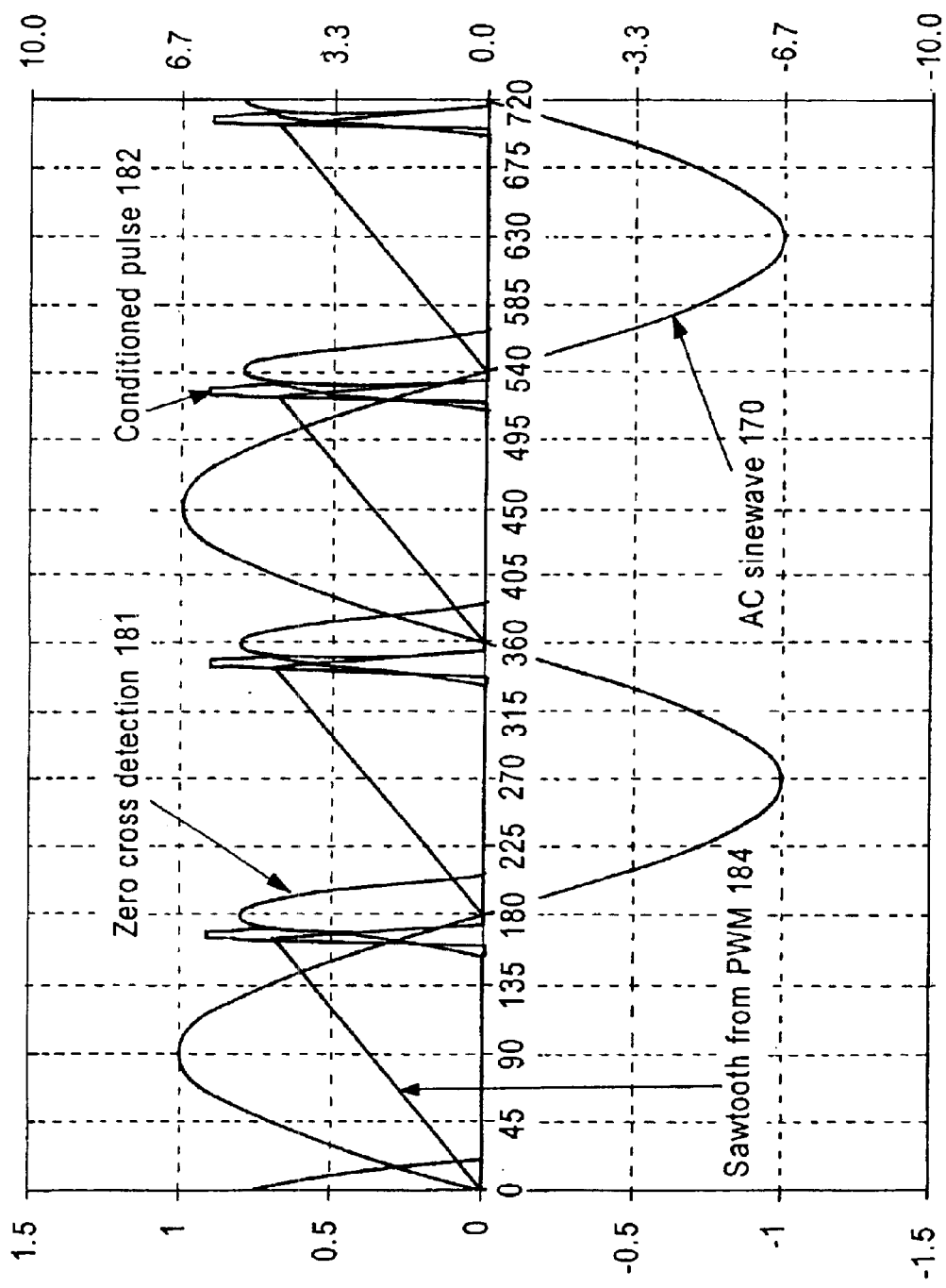
FIGS. 1D and 1E illustrate signal waveforms obtained at various points of the control circuit
Figure 1E:
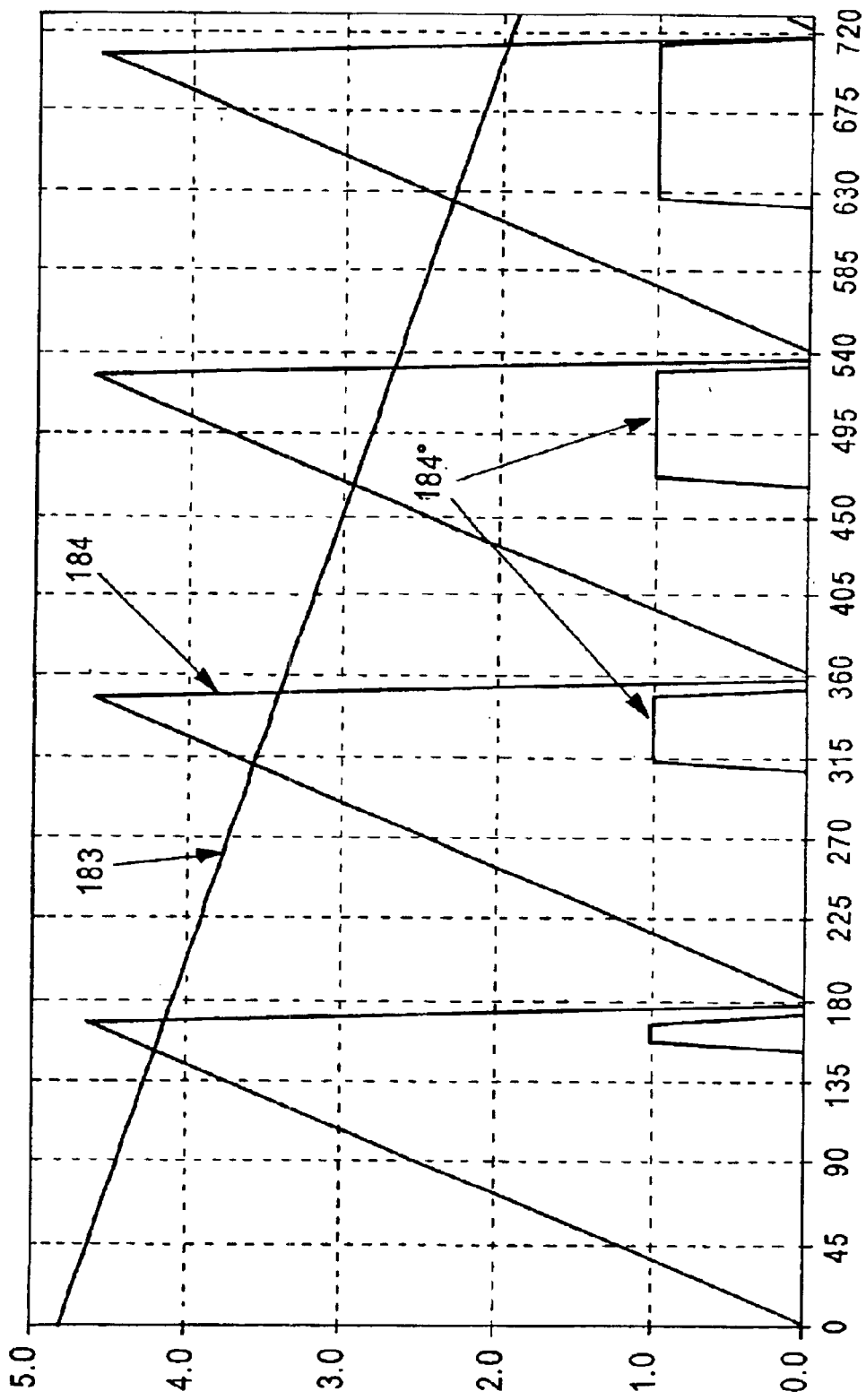

FIG. 1C depicts a block diagram of a control circuit 20 for controlling the charge level of the battery service system 100. The control circuit 20 may be part of the charger 183 or as a separate circuit. FIGS. 1D and 1F illustrate signal waveforms obtained at various points of the control circuit 20. A zero crossing detector 171 is provided to detect an a.c. line voltage zero crossing and responsively generate a pulse-like signal 181 to indicate a status of zero crossing. Signal 181 enters a signal conditioning device 177 that generates a signal 182 that contains a series of conditioned pulse based on the signal 181. Signal 182 then enters a PWM (pulse width modulation) controller 172, which also receives a signal 183 from the processor 101.

Based on the signal 182, the PWM controller generates a sawtooth signal 184 that is synchronized to the signal 182 that indicates to the zero crossing of the a.c. signal 170. The processor 101 generates the signal 183 by converting its own PWM output to provide a rectangular wave output. That signal is buffered and filtered to create a variable d.c. voltage. The processor 101 alters the d.c. voltage level by changing the duty cycle of that PWM output signal of the processor 101.

The PWM controller 172 utilizes a comparator to compare the level of the sawtooth signal 184 and the signal 183 which represents a variable d.c. voltage controlled by the processor 101. In one embodiment, during the time periods where the amplitude of the sawtooth signal 184 is greater than the d.c. voltage represented by the signal 183, the comparator controls the PWM controller 172 to output a low-state output. Otherwise, the comparator controls the PWM controller 172 to output a high-state output. When the output of the PWM controller 172 goes to a low-state, an optoisolator 173 is turned on; otherwise, the optoisolator 173 is turned off. Every time the optoisolator 173 is turned on, it triggers a power control device 174, such as an alternistor, which in turn controls the power transformer and rectifier 175 to charge the battery 123. The power control device 174 is turned on and off repeatedly based on the output of the optisolator 173. Signal 184 in FIG. E shows the on period of the optoisolator 173. The control circuit 20 provides feedback signals of the battery voltage through a feedback circuit 176. The feedback signals then pass an ac-to-dc converter 178 and enter the processor 101.

During operation, a user enters uses the input device to enter a target battery voltage. The processor 101 compares the battery voltage obtained from the feedback circuit 176 with the target battery voltage set by the user. In response to the battery voltage being lower than the target battery voltage, the processor 101 changes the level of signal 183 to increase the on time of the alternistor during the half cycle of a.c. power. For example, the processor 101 may decrease the level of signal 183. In response, the alternistor is turned on earlier, and power is applied to the transformer earlier in each half cycle. Therefore, the voltage output to charge the battery 123 is higher. If the processor 101 detects that the battery voltage has reached, or has an tendency to exceed, the target battery voltage, the processor 101 may start to increase the level of signal 183, which will in turn reduce the voltage output to charge the battery. 123.

In addition to the steps described above, other approaches for determining the battery charging status and controlling of battery charging may be used to implement the battery service system 100. For example, the impedance and/or conductance of the battery can be used to determine if the battery needs to be charged. In one embodiment, if the impedance and/or conductance is greater than a predetermined threshold, it indicates that the battery probably is not in a good condition. Further, an initial load test may be applied to the battery using load resistance to determine if there is a bad cell by observing a resultant decline in voltage versus time using the voltage measurement circuitry. Other well known techniques in testing and charging the battery can also be used to implement the battery service system.

3. Starter Test

In a starter test, the battery service system 100 monitors the voltage at the battery 123 expecting to detect a drop in the voltage level due to the high level of current that the starter 182 takes from the battery. A starter in poor condition will draw more current, which in turn will cause excessive deviation in the battery voltage level.

The battery service system 100 can perform two types of starter tests. The first type of test is a Normal starter test, and the second type of test is an Extended starter test. During the Normal starter test, the ignition system is not disabled for measuring a cranking voltage, while during the Extended starter test, the ignition system is disabled and a current draw reading is obtained.

During the starter test, the battery service system 100 measures the open circuit battery voltage of the battery 123. The battery service system 100 then prompts the operator to start the engine. The starter 182 is evaluated by the amount of voltage drop that occurs in comparison to the, voltage and state of charge of the battery. An exemplary starter test procedure is provided in below:

1) The processor 101 controls to engage the a 50 amp load to the battery 123.
2) The battery service system 100 monitors the battery voltage while the load is applied.
3) The processor 101 controls to disengage the 50 amp load from the battery 123.
4) The processor 101 prompts the operator to start the engine.
5) The battery service system 100 monitors the battery voltage.
6) The processor 101 evaluates the starter 182 based on the amount of voltage drop that occurs in comparison to the voltage and state of charge of the battery.

4. Alternator Test

The alternator 181 is driven by the engine to generate AC power to charge the battery. The battery service system 100 provides a service process to test the health of the alternator. According to one embodiment, the battery service system 100 measures the frequency of a signal taken from the battery terminals 125, which contains an a.c. component that originates from a rectified output from the alternator 181. The battery service system 100 evaluates the frequency measurement to determine the condition of the diodes of the alternator 181 as well as the speed at which the alternator is running.

For example, the battery service system 100 filters a ripple component of the alternator output using bandpass filter 113, gain amplifier 111 and detection circuit 109. The ripple frequency is detected and compared with a threshold frequency. If the ripple frequency is lower than the threshold frequency, it is determined that at least one diode in the alternator's rectifier is defective. In order to calculate the ripple frequency, the ripple voltage is compared with a threshold voltage to count the crossings. An adaptive threshold voltage based on the ripple voltage levels may be used to reduce errors due to the frequent change in the ripple voltage levels.

In another instance, the processor 101 monitors the battery voltage while a 50 amp load is applied. This 50 amp load will cause a bad alternator output to reduce from the typical voltage of about 14 volts. The 50A load is used to stabilize the output signal to better measure its frequency. The test is conducted at an idle engine speed as well at a raised RPM level. The battery service system 100 prompts the user to start the engine and to increase the RPM rate. Insufficient or excessive battery voltage indicates a fault in the alternator 181.

Details of methods and circuits for determining the health of an alternator based on signals obtained from battery terminals are described in U.S. patent application Ser. No. 09/888,385, filed Jun. 26, 2001, entitled "Alternator Testing Method and System Using Ripple Detection," and to U.S. patent application Ser. No. 09/888,382, filed Jun. 26, 2001, entitled "Alternator Testing Method and System Using Timed Application of Load," and to U.S. provisional Patent Application No. 60/214,254, filed Jun. 26, 200, entitled "AUTOMATIC ELECTRICAL SYSTEM TESTING APPARATUS AND METHODS," assigned to the assignee of the present invention, all of which are incorporated herein by reference.

An exemplary alternator test procedure is provided in the following:

1) The processor 101 controls the switch 121 to apply a 50 amp load to the battery 123 to cause significant current flow.
2) The battery service system 100 monitors battery voltage while the load is applied.
3) The processor 101 controls the switch 121 to disengage the 50 amp load from the battery 123.
4) The battery service system 100 prompts the operator start the engine.
5) The battery service system 100 monitors the battery voltage drop. A drop in the battery voltage greater than the loaded voltage indicates that the starter is engaged.
6) The battery service system 100 measures the alternator frequency when the engine is at idle.
7) The battery service system 100 measures battery voltage and peak voltages and frequency when the engine is at idle.
8) The battery service system 100 prompts the operator to increase RPM of the engine.
9) The battery service system 100 measures the alternator frequency.
10) The battery service system 100 measures battery and peak voltages at the increased RPM.
11) The processor 101 controls the switch 121 to apply the 50 Amp load to the battery 123.
12) The battery service system 100 measures battery and peak voltage and frequency at increased RPM while load is applied.
13) The processor 101 controls the switch 121 to remove the 50 Amp load from the battery 123.
14) The processor 101 evaluates the alternator based on the values of the various voltage readings.

5. Noise Determination

As the battery 123 is connected to other parts of the automotive vehicle, system noise from other parts or circuits of the automotive vehicle that are coupled to the battery may appear on the battery terminals. Such system noise may affect the test results. The battery service system 100 provides a noise determination test to determine the status of system noise. If the system noise will affect the test result, a warning message may be generated to alert the operator. Otherwise, services on the battery will proceed.

Figure 2:
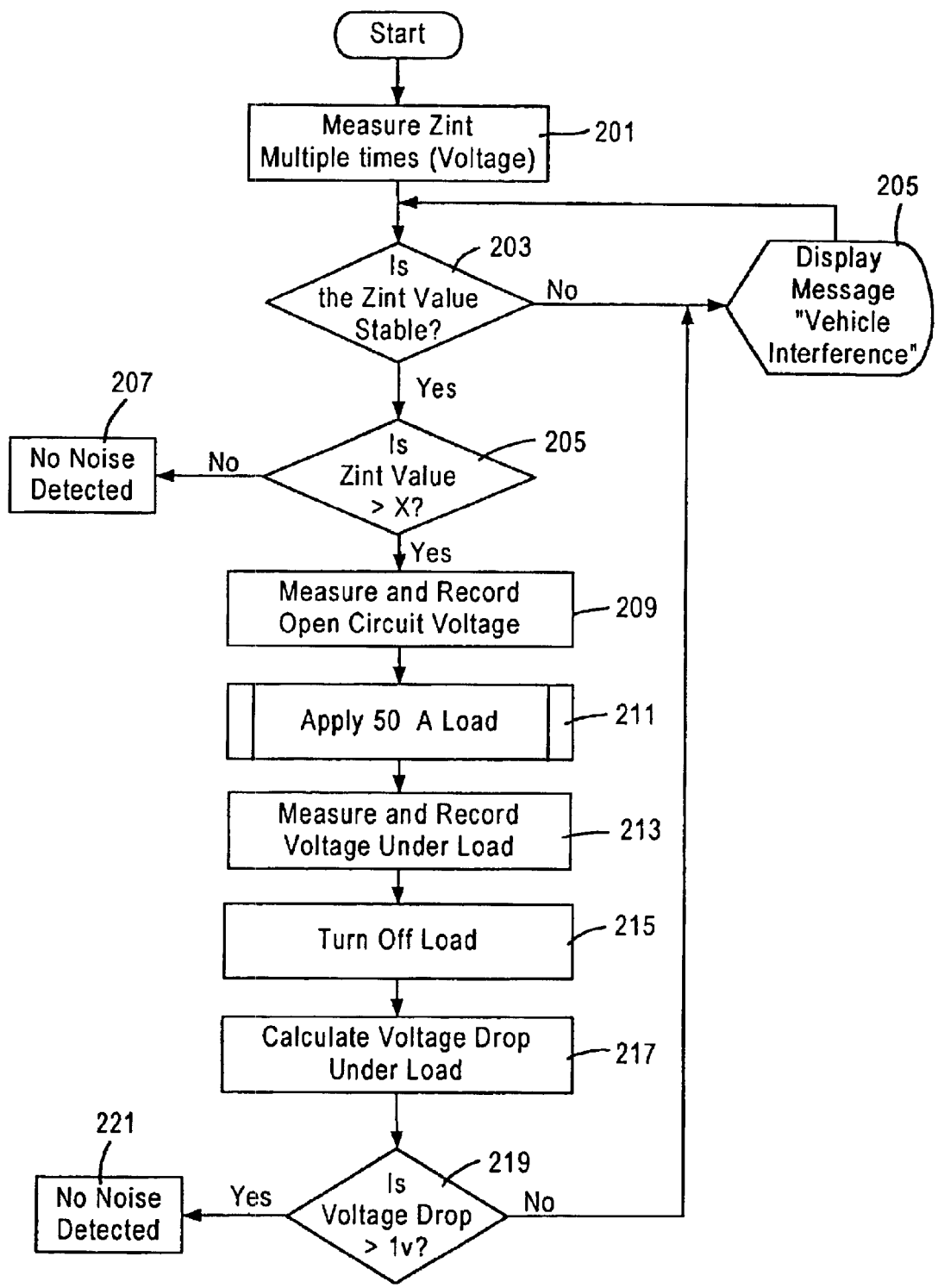
FIG. 2 is a flow chart illustrating the steps for determining the system noise status.

FIG. 2 is a flow chart showing the steps for determining the system noise status. Multiple impedance measurements are taken to detect the presence of varying voltage at the battery terminals. The voltages appearing on the battery terminals are related to battery impedance as well as noise of the vehicle. Voltage variations are caused by various circuits being activated within the automobiles electrical system. This 'noise' can interfere with the impedance measurements.

The battery service system 100 measures battery impedance multiple times (Step 201) and determines if the impedance measurements are stable (Step 203). If the measurements are not stable, it implies that the system noise may affect the readings. The battery service system may generate a warning message (Step 205).

In order to determine whether the impedance measurements are stable, the processor may compare variations of the impedance measurements with a first reference parameter, such as an acceptable tolerance range. If the variations in the impedance readings fall within the acceptable tolerance range, the impedance readings are consider as stable. Different types of batteries may have different tolerance ranges. Based on the type of battery under test, proper tolerance range may be obtained empirically.

Examples for acceptable tolerance range for different types of batteries are:

100–399 CCA; a maximum of 0.20 milliohm
1200–1500 CCA; a maximum of 0.05 milliohm If the impedance fluctuation is less than the tolerance range, it may preliminarily be determined that the system noise will not affect the battery service. However, consistent high system noise may also contribute to stable impedance readings.

In order to prevent false determination, the processor 101 compares the detected impedance with a second reference parameter, such as a reference impedance (step 205). As an example, the reference impedance may be set at 30 milliohm. If the detected impedance is smaller than the reference impedance, it is implied that no excessive system noise contributes to the stable impedance reading (Step 207). Thus, the determination is reliable. On the other hand, if the impedance reading is larger than the reference impedance, it is possible that excessively high system noise may have contributed to the stable impedance reading.

In order to determine whether system noise contributes to the stable impedance reading, the battery service system further applies a load (50 Amp) and further monitors the voltage amplitudes of both DC and the time varying component at the battery (Steps 209–213). The 50-Amp load is then removed and a corresponding voltage drop is measured (Steps 215 and 217). Since system noise is not affected by the 50-Amp load, the measured voltage drop will be small. Thus, a small voltage drop implies that the system noise affects the impedance reading. On the other hand, if the voltage drop is large, it implies that high battery impedance contributes to the high voltage drop and the system noise does not significantly affect the impedance readings. The processor 101 compares the measured voltage drop with a third reference parameter, such as a reference voltage drop greater than 1 Volt (Step 219). If the measured voltage drop is larger than the reference voltage drop, the processor 101 determines that the system noise is acceptable (Step 221). Otherwise, the system noise is not acceptable and a warning message may be generated (Step 205).

6. Multimeter

The battery service system 100 also provides a multimeter for displaying values and/or waveforms of input signals on the display 103. The battery service system 100 may provide separate external current probes for making non-intrusive current measurements. The multimeter function may include an impedance measurement screen and a battery manual load test that allows the operator to apply the load for a period of time set by the operator.

Control of Operation Sequence

Figure 3:
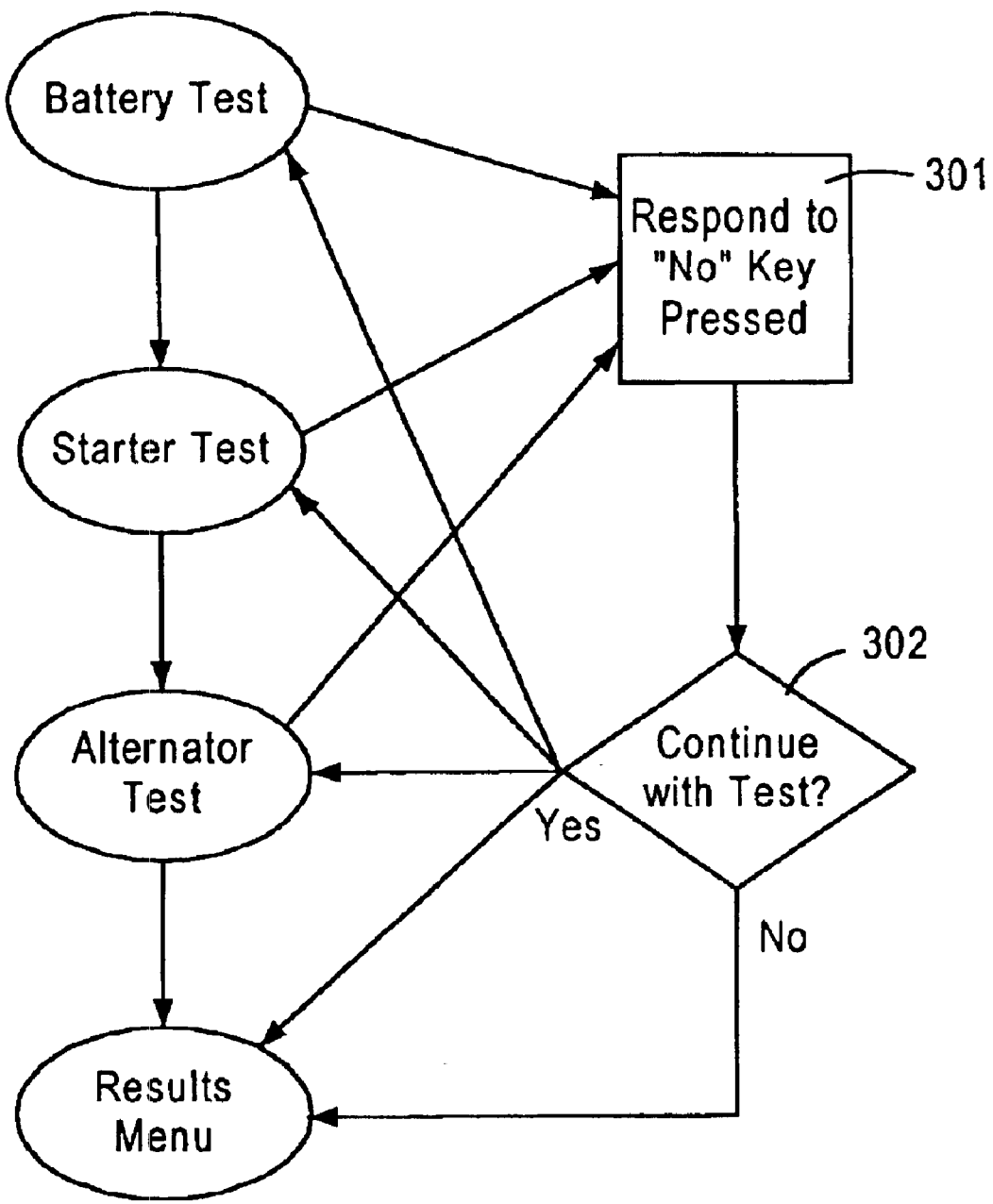
FIG. 3 illustrates a sequence of service processes provided by the battery service system.

FIG. 3 illustrates a sequence of service processes provided by the battery service system 100. The battery service system 100 performs the service processes, including a battery test, a starter test, and an alternator test, in a sequence. During operation, the processor 101 keeps tracking the service process status and saves the status in the memory 102. The battery service system 100 allows the operator to abort a service process and continue to finish the process if he chooses to. For example, the operator may push a "No" key to indicate aborting an active service process, such as the starter test (Step 301). In response, the processor 101 set a flag in the memory indicating the aborted event and saved the test data related to the aborted service process in the memory 102.

When the operator indicates reinstating the aborted sequence, such by pushing a "Continue" button (Step 302), the processor 101 accesses the status and test data stored in the memory 102, and continues the aborted process accordingly. According to one embodiment, the battery service system 100 allows the operator to terminate the aborted sequence. According to another embodiment, the battery service system 100 allows the operator to abort a procedure entirely, and then continue with other tests in the sequence. Test data that has already been gathered is saved in the memory 102 and can be used in other tests at a later time. For example, a user may use the battery service system 100 to conduct a battery test, but then decides to abort the battery test and conducts an alternator test instead. Test data collected during the battery test process, such as measurements, user inputs, etc., can be used in the alternator test, if applicable. Therefore, the user does not need to gather the same data again.

The battery service system 100 may generate a report to the operator providing all the information obtained up to the point where the sequence was terminated. The battery is tested under various loads, RPMs, and operating conditions of the engine. These measurements are stored and then evaluated to determine the condition of the battery.

According to another embodiment, the battery service system may abort or stop a service process automatically in response to a specific event or events, such as the connectors being removed from the battery terminals, the power of the battery service system 100 is low, etc. The specific event or events may be preset by the battery service system 100 and/or by users. The battery service system may continue the aborted service process in response to another event, such as a pushed button or a system detection indicating that proper connections between the battery service system and the battery are restored.

Activation of Service Sequences

The battery service system 100 provides automated activation of service processes in response to a specific event. For example, the battery service system 100 may start a battery service process when the operator turns the ignition key of the automotive vehicle. The service procedure starts in response to the system detecting a very slight change in the battery voltage. However, other events can also cause a voltage change prior to the key being turned (i.e. opening the door and have several bulbs turn on). To avoid that mistake, the battery service system 100 utilizes a threshold reference to assist identify the specific event.

Figure 4:
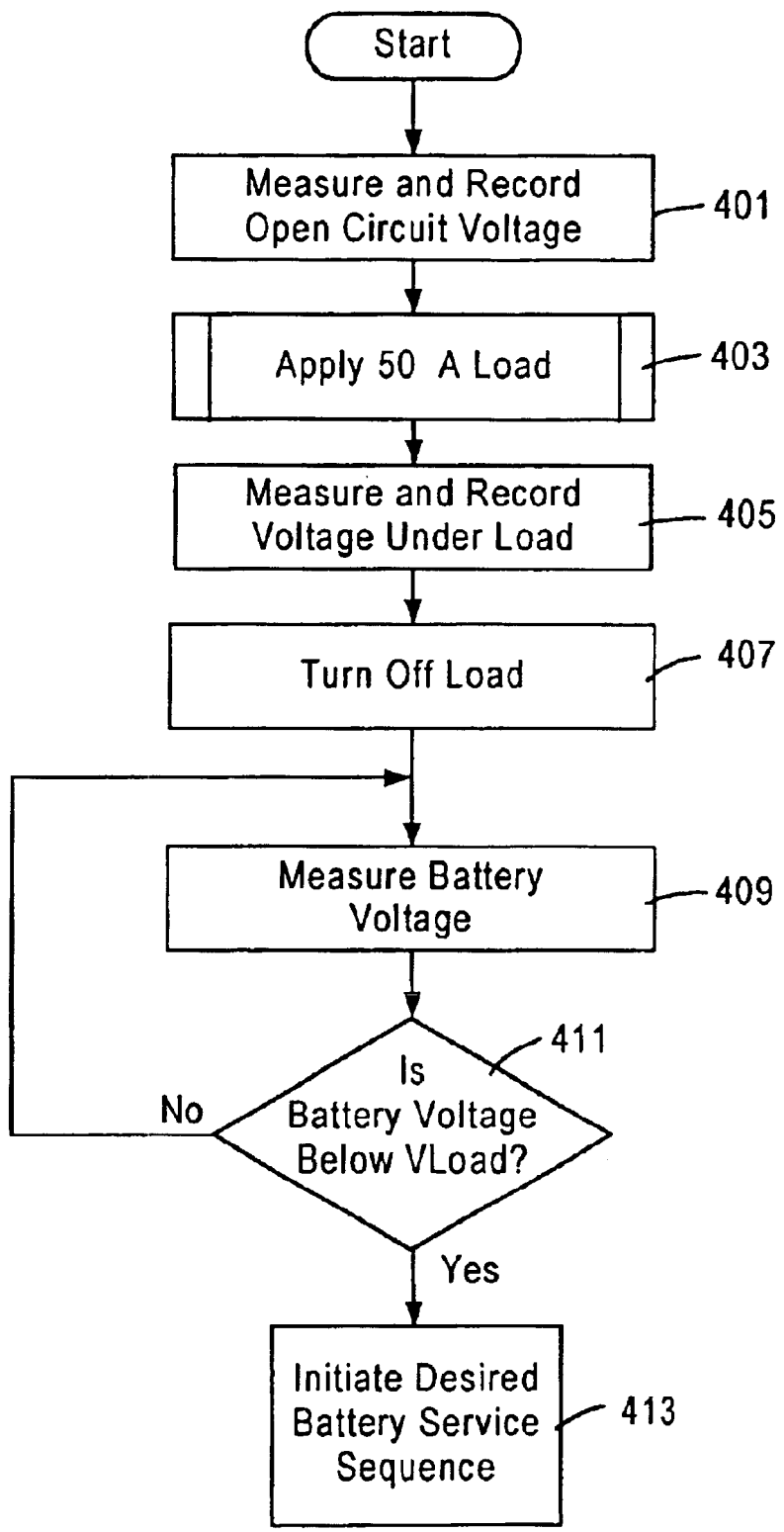
FIG. 4 is a flow chart showing the steps of automated activation of service processes in response to a specific event.

FIG. 4 is a flow chart showing the steps of automated activation of service processes in response to a specific event. In Step 401, the battery service system 100 measures and records open circuit voltage of the battery 123. The battery service system 100 then applies a 50 Amp load to the battery 123 (Step 403). The processor 101 then measures a reference battery parameter, such as the battery's terminal voltage, under the 50-Amp load (Step 405). That measurement is stored in the memory 103 and used as a threshold that is referenced in determining when an item is activated that will draw 50 or more amps. When the engine is turned on, the starter 182 will typically draw 100–200 amps. Thus, the voltage drop on the battery output will be more significant than that under the 50-Amp load. In Steps 409 and 411, the processor 101 measures a battery parameter, such as the output battery voltage, and compares the output battery voltage with the battery's terminal voltage under the 50-Amp load. If the voltage drop is more than the voltage drop under the 50-Amp load, it indicates that the operator has turned on the engine. In response, the battery service system 100 starts the desired battery service process the service process based on system settings (Step 413). On the other hand, if the voltage drop is less than the threshold reference voltage, the battery service system 100 determines that the voltage drop comes from system noise and will not start the battery service process.

Control of Heat Dissipating Fan

Referring to FIG. 1B, the battery service system 100 has a fan 115 to help dissipate heat generated during the operation of the system 100. If the fan 115 does not work normally, the heat generated by the system 100 cannot be dissipated properly. The heat will cause malfunction of the components and the system 100.

The processor 101 controls the ON/OFF status of the fan 115. A temperature sensor 119 may be provided to monitor the system temperature. When the temperature is too high, the processor 101 turns on the fan 115; otherwise, the fan 115 is turned off. Alternatively, the fan 115 may be kept always on when the system 100 operates.

The battery service system 100 has a detection circuit (not shown in FIG. 1B) to monitor the operation of the fan 115. If the fan fails or is blocked, this circuit will provide a feedback signal 166 to the processor to indicate as such. In response, the processor 101 will alert the operator to prevent damage to the system 100.

Figure 5:
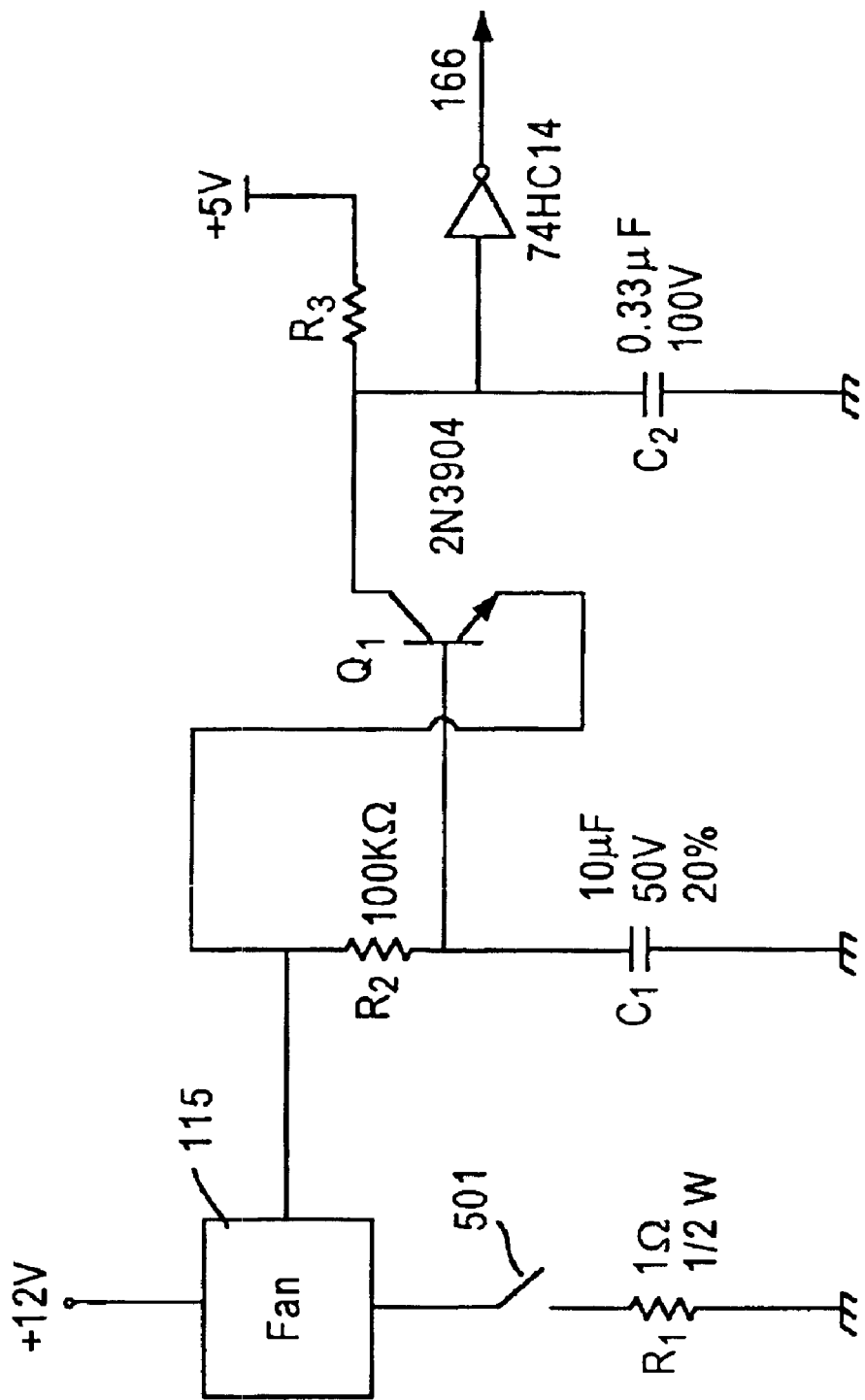
FIG. 5 is an exemplary circuit for monitoring the operation of the fan.

FIG. 5 is an exemplary circuit for monitoring the operation of the fan 115. A +12 volt source is controlled by a switch 501, such as a transistor. When the switch 501 is turned on, current flows through the fan 115 and the 1 ohm resistor. The operational nature of the fan causes a pulsing current, which causes a voltage drop when the pulsing current passes through the 1 ohm resistor. The voltage drop causes a current to pass through R2 and charge C1, which creates a small voltage level at the base of transistor Q1. The voltage at the 1 ohm resistor is also connected to the emitter of transistor Q1. The variation of the voltage drop along with the voltage applied to the base of Q1 causes Q1 to switch between its conductive and non-conductive states.

A +5 volt level is applied to R3 and a current flows through it and charges C2. If the fan 115 is not running, Q1 never turns on and C2 charges to approximately +5 volts. The inverter translates that voltage level to a zero volt level, which is fed back to the processor 101 through signal path 166. The processor 101 interprets that signal as an indication that the fan is not running. If the fan 115 is running, Q1 repeatedly turns on and off and discharges C2 to the extent that the voltage level is below the switching threshold voltage of the inverter. Therefore the inverter puts out a +5 volt level that the processor interprets as the fan is running.

Obtaining Battery Parameters

The battery service system 100 may continuously obtain battery parameters. For example, the battery service system 100 may be configured to apply an AC signal generated by the AC oscillator 190 to the connectors as soon as the system 100 is turned on. As the AC signal is applied to the battery continuously, the processor 101 may continuously obtain the battery's response to the AC signal generated by the AC oscillator and keep track of impedance/conductance readings over time. Since the battery parameters are obtained not only during battery testing, but also on a continuous basis, the obtained parameters collectively provide a better view of the battery status. The impedance/conductance readings over time can be accessed by the operator to assist determination of system noise and/or changes in battery impedance/conductance.

The embodiments described above may be used with any desired system or engine. Those systems or engines may comprise items utilizing fossil fuels, such as gasoline, natural gas, propane and the like, wind and hybrids or combinations thereof. Those systems or engines may be incorporated into other systems, such as an automobile, a truck, a boat or ship, a motorcycle, a generator, an airplane and the like. The embodiments may include or be utilized with any appropriate voltage level, such as about 12 Volts, about 42 Volts and the like.

Software implementing the functions of the battery service system 100 as described in this disclosure may be stored in the memory 102 and/or a machine-readable storage medium, such as optical disks, hard disks, tapes, etc. The machine-readable storage medium may be distributed to customers who want to use the battery service system 100. The software may also be distributed via the Internet. Customers may download the software from a web site and install the programs on their own systems. The machine-readable storage medium may be implemented as memory card and/or memory cartridge that can be inserted into the battery service system 100 and are accessible by the processor 101.

While this invention has been described in connection with an exemplary embodiment, it is to be understood that the invention is not limited to the disclosed embodiment, but on the contrary, is intended to cover various modifications and equivalent arrangements included within the spirit and scope of the appended claims.

What is claimed is:

1. A system for conducting a service on a vehicle comprising:

connectors configured to couple to a battery of the vehicle;

an input device;

a processor coupled to the connectors and the input device for executing control codes to carry out the service; and a memory device coupled to the processor for storing the control codes;

wherein the control codes, when executed by the processor, control the system to perform the steps of:

performing the service;

aborting the service in response to a first specific event; and reinstating the peformed aborted service in response to a second specific events;

wherein the service is a battery test service, an alternator test or a starter test.

2. The system of claim 1, wherein the first specific event is a first user input received from the input device, and the second specific event is a second user input received from the input device.

3. The system of claim 1, wherein the first specific event is an indication of system power low, and the second specific event is an indication of power of the system being restored.

4. The system of claim 1, wherein the processor generates a report providing information obtained up to the point where the service was terminated.

5. A system for conducting a service on a vehicle comprising:

connectors configured to couple to a battery of the vehicle;

an input device;
a processor coupled to the connectors and the input device for executing control codes to carry out the service; and
a memory device coupled to the processor for storing the control codes;
wherein the control codes, when executed by the processor, control the battery service system to perform the steps of:
aborting the service in response to a first specific event; and
reinstating the aborted service in response to a second specific event;
wherein the first specific event is an indication of an improper connection between the system and the battery, and the second specific event is an indication of a proper connection being restored between the system and the battery.

6. A battery service system for obtaining a testing condition of a battery, comprising:
connectors configured to connect to the battery for receiving input signals;
a memory device for storing control codes and a first reference parameter; and
a processor coupled to the connectors and the memory device;
wherein the control codes, when executed by the processor, control the battery service system to perform the machine-implemented steps of:
obtaining multiple measurements of a specific battery parameter by determining the specific battery parameter based on the input signals multiple times; and
determining the testing condition based on the first reference parameter, the multiple measurements of the specific battery parameter, and a determination rule;
wherein the testing condition indicates whether noise affects the multiple measurements of the specific batter parameter.

7. The battery service system of claim 6, wherein
the first reference parameter is a specific range; and
the determination rule requires that the variations of the multiple measurements of the specific battery parameter fall within the specific range.

8. The battery service system of claim 7, wherein the processor determines the battery as stable if the changes of the multiple measurements of the specific battery parameter fall within the specific range.

9. The battery service system of claim 7, wherein, in response to the battery being stable, the processor is configured to further perform the machine-implemented step of comparing the multiple measurements of the specific battery parameter and a second reference parameter.

10. A battery service system for obtaining a testing condition of a battery, comprising:
connectors configured to connect to the battery for receiving input signals;
a memory device for storing control codes and a first reference parameter; and
a processor coupled to the connectors and the memory device;
wherein the control codes, when executed by the processor, control the battery service system to perform the machine-implemented steps of:
obtaining multiple battery parameters by determining a battery parameter based on the input signals multiple times; and
determining the testing condition based on the first reference parameter, the multiple battery parameters, and a determination rule;
wherein in response to the battery being stable, the processor is configured to further perform the machine-implemented step of comparing the multiple battery parameters and a second reference parameter, and
wherein the processor is configured to carry out the following machine-implemented steps in response to the multiple battery parameters being larger than the second reference parameter:
measuring an open circuit parameter of the battery based on the input signals;
determining a battery response to a reference load coupled to the battery;
decoupling the reference load from the battery;
measuring a change in the battery response; and
determining a test noise status based on the battery response.

11. The battery service system of claim 10, wherein the battery service system determines that test noise is acceptable based on the change in the battery response and a third reference parameter.

12. A vehicle service system for conducting a process on a vehicle, comprising:
connectors configured to connect to a battery of the vehicle to receive input signals;
a memory device for storing control codes and a reference threshold generated based on the battery response to a reference load coupled to the battery; and
wherein the control codes, when executed by the processor, control the battery service system to carry out the machine-implemented steps of:
determining a parameter based on the input signals;
comprising the parameter and the reference parameter based on a determination rule; and
initiating the process based on a result of the comparing step.

13. A system for conducting a service comprising:
connectors configured to couple to a battery;
an input device for receiving control signals;
a processor for executing control codes to carry out the service; and
a memory device configured for storing the control codes;
wherein the control codes, when executed by the processor, control the battery service system to perform the steps of:
monitoring the operation of the service;
saving parameters obtained during the service;
terminating the service in response to a first specific event;
recording an interruption point of the service;
accessing information related to the interruption point in response to a second specific event; and
resuming the service from the interruption point.

14. The system of claim 13, wherein the first specific event is a first user input received from the input device, and the second specific event is a second user input received from the input device.

15. The system of claim 13, wherein the first specific event is an indication of an improper connection between the battery service system and the battery, and the second specific event is an indication of a proper connection between the battery service system and the battery being restored.

16. The system of claim 13, wherein the first specific event is an indication of system power low, and the second specific event is an indication of power of the battery service system being restored.

17. The system of claim 13, wherein the processor generates a report providing information obtained up to the point where the service was terminated.

18. A method for conducting a service comprising the machine-implemented steps of:

monitoring the operation of the service;

saving parameters obtained during the service;

terminating the service in response to a first specific event;

recording an interruption point of the battery process;

accessing information related to the interruption point in response to a second specific event; and resuming the service from the interruption point.

19. The battery system of claim 18, wherein the first specific event is a first user input received from the input device, and the second specific event is a second user input received from the input device.

20. The battery service system of claim 18, wherein the first specific event is an indication of an improper connection between the battery service system and the battery, and the second specific event is an indication of a proper connection between the battery service system and the battery being restored.

21. The battery service system of claim 18, wherein the first specific event is an indication of system power low, and the second specific event is an indication of power of the battery service system being restored.

22. The battery service system of claim 18, wherein the processor generates a report providing information obtained up to the point where the battery service was terminated.

23. A system comprising:

connectors configured to couple to a battery for receiving input signals;

a processor coupled to the connectors;

a memory device coupled to the processor for storing data and control codes;

wherein the control codes, when executed by the processor, control the system to perform a battery test, a battery charge service and at least one of an alternator test and a starter test.

24. The system of claim 32, wherein the control codes, upon execution of by the processor, control the battery service system to perform the battery test, the starter test, the alternator test and the battery charge service in a predetermined sequence.

25. The system of claim 23, wherein the control codes, upon execution of by the processor, control the battery service system to sequentially perform a battery test, a starter test, an alternator test and a battery charge service.

26. A system for testing an electrical component, comprising:

connectors configured to connect to the electrical component for receiving input signals;

a memory device for storing control codes and a reference threshold; and a processor coupled to the connectors and the memory device;

wherein the control codes, when executed by the processor, control the system to perform the machine-implemented steps of:

obtaining multiple measurements of a specific parameter of the electrical components by determining the specific parameter multiple times; and determining a testing condition based on the reference threshold, the multiple measurements of the specific parameter, and a determination rule;

wherein the testing condition indicates whether noise affects the multiple measurements of the specific parameter.

* * * * *